United States Patent [19]

Reed

[11] Patent Number: 4,868,507

[45] Date of Patent: Sep. 19, 1989

[54] MICROCOMPUTER CONTROLLED RESISTANCE FAULT LOCATOR CIRCUIT

[75] Inventor: Eric L. Reed, Austin, Tex.

[73] Assignee: Minnesota Mining and Manufacturing Company, St. Paul, Minn.

[21] Appl. No.: 276,418

[22] Filed: Nov. 23, 1988

[51] Int. Cl.[4] ............................................. G01R 31/02
[52] U.S. Cl. ..................................... 324/525; 324/512; 324/541; 364/451; 379/26
[58] Field of Search ...................... 324/525, 522, 65 R, 324/512, 539, 541, 543, 544; 379/26; 364/481, 482, 483

[56] References Cited

U.S. PATENT DOCUMENTS 2,615,076  10/1952  Miller .................................. 324/525
4,751,724   6/1988  Amadio et al. .................... 379/26 X Primary Examiner—Reinhard J. Eisenzopf
Assistant Examiner—Robert W. Mueller
Attorney, Agent, or Firm—Donald M. Sell; Walter N. Kirn; Robert L. Marben

[57] ABSTRACT

A resistance fault locator circuit having a digitally controlled current split circuit, an error amplifier and a programmed microcomputer plus a switching means for establishing several modes of operation of the circuit for determining the distance to a fault between two conductors of a cable.

5 Claims, 7 Drawing Sheets

MICROCOMPUTER CONTROLLED RESISTANCE FAULT LOCATOR CIRCUIT

FIELD OF THE INVENTION

The invention presented herein relates to electronic test circuits and more particularly to resistance fault locator circuitry having a microcomputer controlled current split circuit used in a null bridge configuration for locating resistance faults between two conductors of a cable.

BACKGROUND OF THE INVENTION

Cables having large numbers of insulated conductors are widely used today, for example, in telephone communication systems. Frequently these cables are either buried underground or suspended above ground between poles or towers. Faults sometimes develop between two or more of the conductors of these cables, requiring repair or replacement of the cable or a portion thereof. Such faults typically include a short circuit between two or more of the conductors, or a partial breakdown of the insulation between the conductors and high resistance connections caused by water or moisture within the cable. To facilitate the correction of a fault, it is desirable to know the exact location of the fault. This is particularly true in the case of underground cables where a hole must generally be dug to permit access to the troubled area.

Access points are generally provided at pedestals or towers located at spaced apart positions along underground cables and aerial cables. Heretofore, there have been some attempts to determine the location of a fault between the conductors of a cable by means of measurements made on the cable at one of the access points. In one widely used technique of the prior art, a bridge circuit, such as a Varley bridge, is used to determine the resistance between the access point and the fault. From the value of resistance measured, the lineman or repairman calculates the length of the conductor. This approach has several disadvantages. For example, it requires calculations on the part of the lineman or repairman which are time consuming and subject to human error. Resolution drops off toward the ends of the cable, making it difficult to locate faults accurately in these areas. Sensitivity is relatively poor, and is not possible to locate some high resistance faults with the bridge approach. Also, bridges typically pass currents on the order of hundreds or thousands of microamperes through the faulty conductor, and currents of this level sometimes dry out or temporarily eliminate the fault, thereby preventing its location and correction.

A test circuit disclosed in U.S. Pat. No. 3,800,216 to Robert H. Hamilton avoids some of the disadvantages associated with the prior art Varley bridge in that his test circuit employs current levels that are very low and uses an adjustable control having a dial calibrated in units of length which eliminates the need for the operator to make complicated calculations. Use of such test circuit, however, requires a selection to be made from a plurality of calibration resistors plus the adjustment of a number of potentiometer settings. Such operator functions provide chances for operator errors and is also time consuming.

SUMMARY OF THE INVENTION

A resistance fault locator circuit embodying the invention presented herein avoids many of the disadvantages presented by prior resistance fault locator circuits by the use of a digitally controlled current split circuit with a programmed microcomputer to provide a circuit that can be easily and accurately operated.

The resistance fault locator circuit of the invention presented herein is adapted for connection to a plurality of conductors which extend between the locator circuit and a remote point with two of the conductors known to have a fault between them. The locator circuit operates to determine the distance from the circuit to the fault. The locator circuit includes a current split circuit that has a first, second and third terminal plus a digital input. The input signal to the digital input determined the ratio of the current at the first terminal to the sum of the currents at the first and second terminals. An error amplifier is included which provides an analog signal at its output dependent on the polarity and magnitude of an analog signal supplied to its input which is dependent on the magnitudes of the currents at the first and second terminals. The error amplifier has its output connected to an analog to digital circuit for providing a digital signal representative of the output of said error amplifiers. A programmed microcomputer is connected to receive the output of the analog to digital circuit and operates to establish the digital input signal to the digital input of the current split circuit to cause magnitude of an analog signal supplied to the input of the error amplifier to be reduced to a minimum level.

The locator circuit also has a resistor of known value. A switching means is included which is operable for establishing a first and a second mode of operation of the locator circuit. The first mode determines the distance along one of the two faulted conductors between the locator circuit and the remote end of the one conductor with the second mode determining the ratio of the resistance of the one faulted conductor between the locator circuit end of the one faulted conductor and the fault position to the total resistance of the one faulted conductor. The programmed microcomputer operates to multiply the results of the first and second modes of operation to obtain the distance to the fault from the locator circuit. The switching means provides connections for the first mode of operation for the passage of the current at the first terminal through the one faulted conductor with current at the second terminal flowing through a locator circuit resistor of the known value with the resistor connected at one end to the locator circuit end of the one faulted conductor with the input of the error amplifier connected for receiving the signal between the other end of the resistor and the remote point end of the one conductor. The switching means also provides connections for the second mode of operation for the passage of current at the first terminal between the fault at the one conductor and the remote end of the one conductor with the current at the second terminal flowing between the fault at the one conductor and the locator circuit end of the one conductor with the input of the error amplifier connected for receiving the signal between the ends of the one conductor.

The switching means of the locator circuit also serves to establish a third and fourth mode of operation for the locator circuit which only requires the use of one nonfaulted conductor. The third mode determines the distance along one of the two conductors between the locator circuit and the remote end of the one conductor with the fourth mode determining the ratio between the resistance of the one faulted conductor from the locator circuit end of the one faulted conductor and the fault position to the resistance of the one faulted conductor plus the resistance of a third (non-faulted) conductor. The programmed microcomputer operates to obtain twice the multiple of the results of the third and fourth modes of operation to obtain the distance to the fault from the locator circuit end of the one faulted conductor. The switching means provides connections for the third mode of operation for the passage of the current at the first terminal through a series circuit of the one conductor and the third (non-faulted) conductor with current at the second terminal flowing through the locator circuit resistor which is connected at one end to the locator circuit end of the one faulted conductor with the input of the error amplifier connected for receiving the signal present between the other end of the locator circuit resistor and the locator circuit end of the third (non-faulted) conductor. The switching means also provides for the fourth mode of operation for connections for the passage of current at the first terminal via a series circuit that includes the one faulted conductor from the fault position at the one conductor to its remote end and the third (non-faulted) conductor and provides for the passage of current at the second terminal of the one faulted conductor from its fault position to the locator end of the conductor. The input of the error amplifier is connected during such mode for receiving the signal between the locator circuit end of the one faulted conductor and the locator circuit end of the third (non-faulted) conductor.

A current split circuit for the locator circuit includes a multiplying digital to analog converter (DAC) and a controller circuit portion with the DAC having a first terminal and the aforementioned second and third terminals of the current split circuit plus its digital input. The currents at the first terminal of the DAC and second terminal of the circuit are per the current ratio established by the input to the digital input so long as such terminals are at the same potential.

The controller circuit portion of the current split circuit establishes the first terminal of the DAC and second terminal of the current split circuit at the same potential. The controller circuit portion has an operational amplifier with two input terminals and an output terminal. One of the input terminals is operatively connected to the first terminal of the DAC and the other of the two input terminals is connected to the second terminal of the current split circuit. A negative feedback semiconductor linear circuit (NFSLC) is also included which is operatively connected between the output terminal of the operational amplifier and the first terminal of the DAC. The NFSLC has a circuit portion which includes a controlled semiconductor linear device (CSLD) for conduction of the current between the first terminal of the DAC and the first terminal of the current split circuit. The CSLD has a control electrode operatively connected to the output terminal of the operational amplifier.

The circuit portion of the NFSLC also includes a constant reference voltage source (CRVS) providing a voltage polarity and magnitude for enabling current at the first terminal of the current split circuit to flow independent of application voltages on the cable conductors or voltage drops through the CSLD or circuit wiring.

BRIEF DESCRIPTION OF THE DRAWINGS

The features of the invention presented herein, which are referred to above and others, will become more apparent to those skilled in the art upon consideration of the following detailed description which refers to the accompanying drawings wherein.

DETAILED DESCRIPTION

Figure 1:
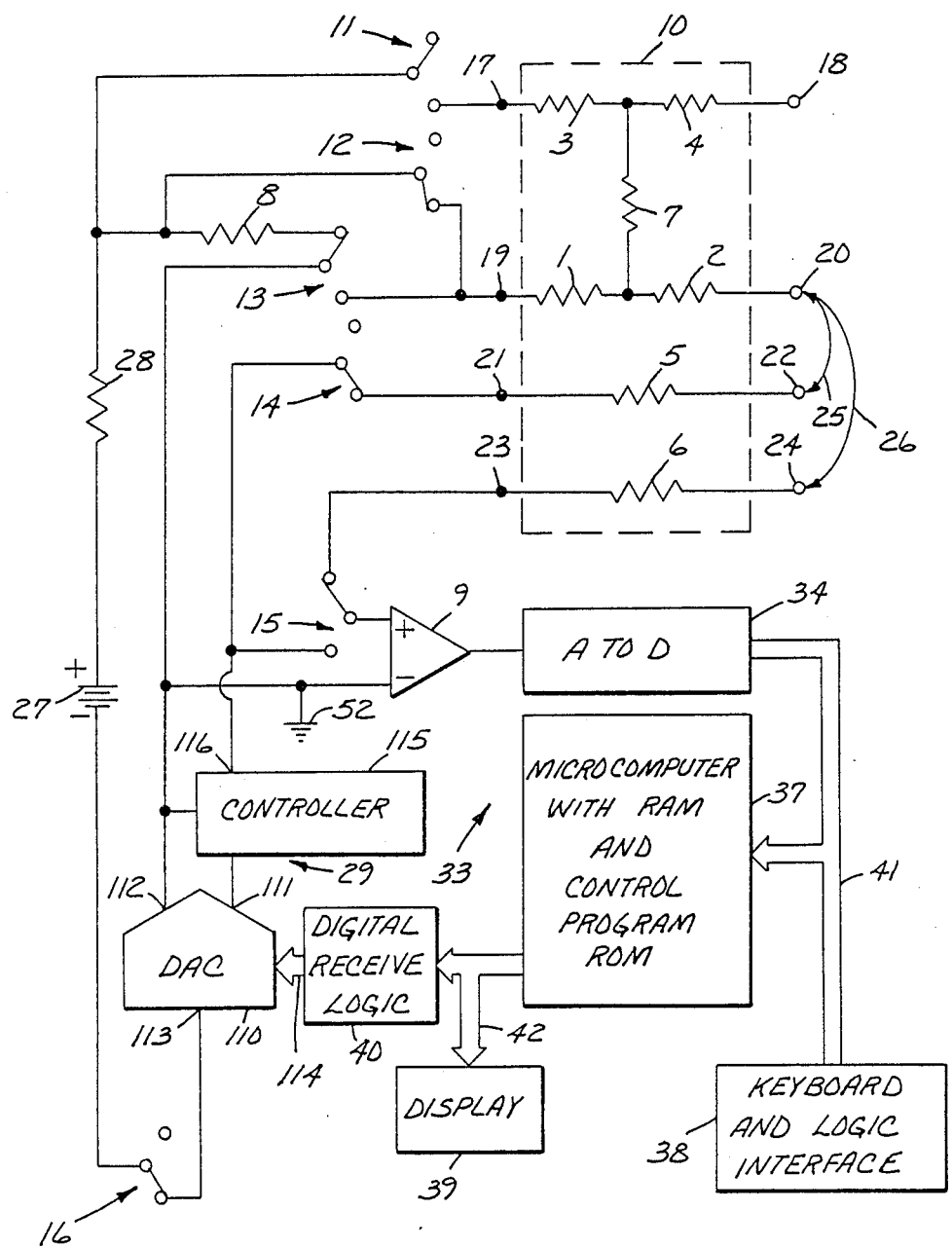
FIG. 1 is a schematic of the fault measurement circuit embodying the invention arranged for one mode of operation.

Referring to FIG. 1 of the drawing, the portion within the area defined by the closed dotted line 10 is a schematic representation of four conductors of a cable extending between two access points wherein a resistive fault has been determined to exist between two of the conductors with the other two conductors available for use in determining the distance to the fault (D.T.F.). The four conductors are connected at one end to the resistance fault locate measurement circuit embodying the present invention. A first conductor extends between terminals 17 and 18 and is represented by two resistances 3 and 4. A second conductor is similarly represented by resistances 1 and 2 and extends between terminals 19 and 20. A resistance fault, represented by the resistance 7, exists between the first and second conductors. The resistance 7 is shown connected between the point common to resistances 1 and 2 and the point common to resistances 3 and 4. A third conductor extending between terminals 21 ans 22 and a fourth conductor extending between terminals 23 and 24 are the "good" non-faulted conductors of the four conductors. Resistances 5 and 6 represent the third and fourth conductors, respectively. In the course of using the measurement circuit, it is necessary to have a conductive strap 25 connected between the far-end terminals 20 and 22 of the second and third conductors with a second conductive strap 26 connected between the far-end terminals 20 and 24 of the second and fourth conductors when all four conductors are used. The second conductive strap 26 is not needed if the fourth conductor is not used or is not available.

Referring to the resistance fault locate measurement circuit portion of FIG. 1, the circuit includes six relays 11–16, a calibrated resistor 8, a current limiting resistor 28, a D.C. power source 27, and a current split circuit portion 29 having a controller 115 and a digital to analog converter (DAC) 110. In addition, the measurement circuit portion includes a circuit portion 33 having an amplifier 9 for monitoring the polarity and magnitude of the voltage between ground 52 and another monitoring point determined by the position of relays 11–15. The remainder of circuit portion 33 is connected between the output of the amplifier 9 and the digital input 114 of DAC 110 and serves to change the ratio of the current split provided by the current split circuit portion 29 until the output of the amplifier 9 is a minimum. It includes an analog to digital (A to D) converter 34 connected to the output of amplifier 9, a microcomputer 37 having a control program read only memory (ROM) and a random access memory (RAM), a keyboard and logic interface 38, all of which are interconnected by a control and data bus 41. The circuit portion 33 also includes an output data bus 42 for microcomputer 37, a display 39 and a digital receive logic 40. The output bus 42 is connected between the microcomputer 37, the display 39 and the digital receive logic 40. The output of the digital receive logic 40 is connected to the digital input 114 of the DAC 110.

The relays 11–16 each have a movable contact which is in contact with one or the other of two fixed contacts. When the movable contact is in contact with the lower fixed contact, as shown in FIG. 1, a relay shall be considered to be set and when in contact with the upper fixed contact the relay shall be considered to be reset. The relay type used for relays 11–16 is preferably a locking or latching type relay which minimizes the power needed for placing the fixed contact for each relay in the set or reset position. Using a latching type relay, the position for the movable contact is in accordance with the last pulse supplied to it. For example, if the last pulse received by a relay was a reset pulse, the fixed contact will be in the reset (upper) position and remain there until the relay receives a set pulse to place the fixed contact in the set (lower) position.

Referring to FIG. 1, the movable contact of relay 11 is connected to one end of resistor 28 which has its other end connected to the positive side D.C. power supply 27. The lower fixed contact for the set position for the relay 11 is connected to terminal 17. The upper fixed contact is not connected. The relay 12 is similarly connected, but with the lower fixed contact connected to terminal 19. Relay 13 has its upper or reset fixed contact connected to one end of the calibrated resistor 8 which has its other end connected to the one end of resistor 28 and the movable contact of relay 12. The movable contact of relay 13 is connected to ground 52. The lower or set fixed contact of relay 13 is connected to the terminal 19. Relay 14 has its lower or set fixed contact connected to terminal 21 with its movable contact connected to the lower or set fixed contact of relay 15 and to the controller 115 at 116. The upper fixed contact of relay 14 is not connected. Relay 15 has its upper or reset fixed contact connected to terminal 23 and its movable contact connected to the positive input terminal of amplifier 9. The movable contact of relay 16 is connected to the negative side of the D.C. power supply 27. Its lower or set fixed contact is connected to the terminal 113 of DAC 110 while its upper fixed contact is not connected.

Referring to the current split circuit portion 29, the controller 115 is connected to terminal 111 of DAC 110. The controller 115 is connected also to ground 52 as is the terminal 112 of the DAC 110.

The various relays 11–16 are operated under the control of the microcomputer 37 and provide the switching means by which four different operating modes for the measurement circuit can be established. One mode is the distance to strap (D.T.S.) (4-conductor) mode which requires use of a percent fault locate mode (4-conductor) to determine the distance to fault (D.T.F.). Another mode is the distance to strap (D.T.S.) (3-conductor) mode with the fourth mode being the percent fault locator mode (3-conductor) which is needed to determine the D.T.F. when 3-conductors are used.

The distance to strap (4-conductor) mode provides for a determination of the resistance of the first conductor (resistors 1 and 2) which is multiplied by the temperature conversion factor, $K_t$, which is dependent on the temperature of the conductor estimate and the temperature coefficient of resistance for the conductor and by the gauge conversion factor, $K_g$, which is dependent on wire size and twist factor of the conductor to provide the distance to the strap (D.T.S.). The percent fault locator mode (4-conductor) is then used which determines the ratio of resistor 1 to the sum of resistors 1 and 2. Knowing this ratio, the distance to the fault (D.T.F) is determined by multiplying such ratio by the determined distance to the strap (D.T.S).

The distance to strap (3-conductor) mode is used when the fourth conductor, a good conductor, is not available to provide a determination of the resistance of the first conductor (resistors 1 and 2). It requires that there be a basis for assuming that resistance of the third conductor (resistor 5) is approximately equal to the faulted first conductor (resistors 1 and 2). The resistance determined for $R_1$ plus $R_2$ is then multiplied by $K_g$ and $K_t$ to convert the resistance to distance which is the distance to the strap (D.T.S.). The use of the 3-conductor mode for determining the distance to fault requires use of the fourth or percent fault locator mode to determine the ratio of resistor 1 to the sum of resistors 1, 2 and 5. This ratio when multiplied by two times the distance to the strap (D.T.S) determined by the 3-conductor mode provides the distance to the fault (D.T.F.).

Figure 2:
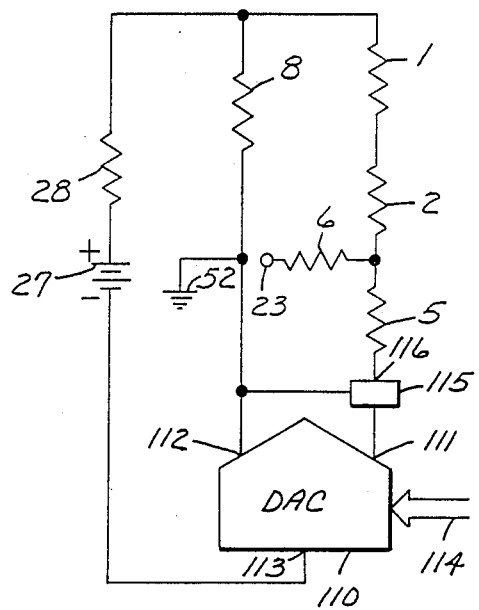
FIG. 2 is a simplified schematic of the circuit shown in FIG. 1.

FIG. 1 of the drawing shows the resistance fault measurement circuit with relays 11–16 positioned to establish the distance to strap (4-conductor) mode of operation wherein relays 11, 13 and 15 are in the reset position and relays 12, 14 and 16 are in the set position. FIG. 2 is a simplified schematic of the circuitry of FIG. 1 (less the circuit portion 33) that is provided for the distance to strap (4-conductor) mode of operation. As easily seen in FIG. 2, the known resistance 8 plus the conductor represented by resistors 1 and 2 and the conductor 5 represented by resistor 5 are connected as a part of the circuitry for this mode of operation with the conductor represented by resistor 6 used to provide a voltage monitoring point at terminal 23.

Figure 3:
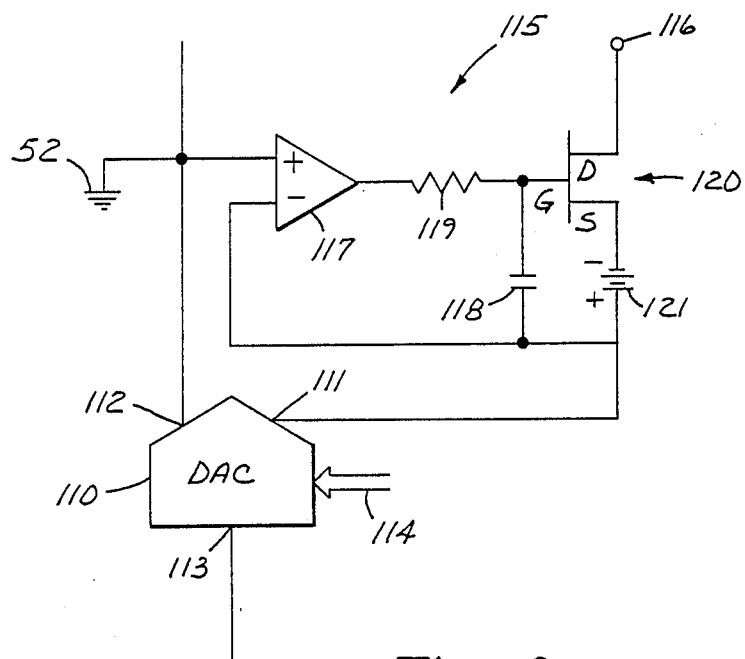
FIG. 3 is a schematic showing a portion of the circuit of FIG. 1 in greater detail.

An important aspect of the invention presented herein is the current split circuit portion which includes the controller 115 and DAC 110. The current split circuit will therefore be considered in detail before any further consideration is given to the circuitry of FIG. 1. Referring to FIG. 3 of the drawing, the current split circuit is shown with the controller 115 set forth in detail. DAC's usable in the current split circuitry portion are multiplying DAC's which are well known and are commercially available. The DAC used in FIG. 3 is an N-bit CMOS DAC based on an R-2R resistive ladder network. The R-2R ladder divides the current that is present at terminal 113 (generally referred to as the $V_{ref}$ pin of a DAC) into binary weighted currents which are steered by current steering switches relative to terminal 112 (generally referred to as the Out 2 pin of a DAC), which is at DAC power supply ground potential. The digital input to the digital input port 114 of the DAC determines the position of the current steering switches, one switch for each digital input line, with a logic "1" causing the switch to steer current via the terminal 111 and a logic "0" causing the switch to steer current via the terminal 112. The fraction of the current that is steered by a current steering switch is weighted in accordance with the value of the binary input directed to a particular current steering switch. Thus, if the digital input for a 8-bit CMOS DAC was all "0's", all of the current flow would be via terminal 112, while a digital input of "10000000" causes half of the current to flow via terminal 112 and the remainder via terminal 111. Further, if the input is "11111111", then only 1/256 of the current at terminal 113 flows via the grounded terminal 112. The sum of the currents at terminals 111 and 112 is the same for all digital inputs. Such functioning of the CMOS DAC is possible only if the terminals 111 and 112 are at the same potential and furthermore are at zero volts relative to the power supply input voltages (not shown) supplied to the DAC. The standard method of holding terminals 111 and 112 at ground is to use an external operational amplifier that is connected as a current to voltage converter providing feedback current to the RFB terminal (not shown) of the DAC. This is not done in the circuitry of FIG. 3. If the RFB terminal of the DAC were used in the usual manner, the accuracy of the current at terminal 111 would not be preserved, but would be converted into a voltage output variable.

The DAC, if it is a four quadrant multiplying DAC, is operable for current flow either to or away from terminal 113, allowing the current split circuitry portion of the present invention to have a sourcing or sinking current configuration. A sinking current configuration is shown in FIGS. 1-9, wherein the currents flow toward terminals 111 and 112. A sourcing current configuration is one in which the currents flow away from terminals 111 and 112. Some two quadrant multiplying DACs are usable, but only in the sinking current configuration.

The remainder of the circuitry shown in FIG. 3, which will be referred to as a controller 115, functions to force a null or virtual ground at terminal 111 will respect to grounded terminal 112. It includes an operational amplifier 117 with a negative feedback semiconductor linear circuit (NFSLC). The controller 115 serves also to preserve the accuracy of the current at terminal 111 as a measurement variable. The controller 115 has a constant voltage reference source (CRVS) 121 as a part of the NFSLC that allows bipolar voltages to be presented at its terminal 116. The controller 115 preserves the accuracy of the current at terminal 111 as a measurement variable by passing this same current on through the constant reference voltage source (CRVS) 121 and a controllable semiconductor linear device (CSLD) 120, which is also a part of the NFSLC, such that only minor errors in this split current at the DAC terminal 111 are conducted through the control terminal of CSLD 120. As has been noted, the DAC 110 can operate with either polarity of current while the controller 115 is inherently a unipolar circuit that can be configured for one polarity or the other. The NFSLC includes a capacitor 118 and resistor 119 for stabilization of the internal closed loop that includes the operational amplifier 117, the CSLD 120 and the CRVS 121. The capacitor 118 is connected in series with the resistor 119 with such series circuit connected between the inverting input and the output of the operational amplifier 117 with resistor 119 connected to the output of the operational amplifier. A suitable CSLD device 120 which operates as a controllable linear voltage dependent resistor, can be provided, in the case of FIG. 3, by a N-channel MOSFET or JFET or a NPN bipolar transistor or NPN Darlington amplifier. For example, FIG. 3 is shown using a N-channel JFET with its gate connected to the connection common to the resistor 119 and capacitor 118 and its source connected to the negative side of the CRVS 121. The drain of the JFET 120 is connected to terminal 116 of the current splitting circuit portion. The inverting input of operational amplifier 117 and the positive side of the CRVS 121 are connected to terminal 111 of DAC 110. The controller 115 of FIG. 3 causes current flow toward DAC terminal 111 making the circuit a sinking version of the current splitting circuit portion.

As mentioned above, it is the function of the controller 115 to force terminal 111 to be at the same potential as terminal 112 permitting the digital input at 114 of the DAC 110 to be determinative of the amount of current split between the current at terminal 111 and terminal 112. This "forced null" between terminals 111 and 112 is provided by the action of the NFSLC of the controller 115. Explanation of such functioning of the controller 115 will be made in relation to FIGS. 2 and 3 wherein loads are represented by resistor 8 connected at one end to terminal 112 of DAC 110 and series connected resistors 1, 2 and 5 connected to terminal 116. The opposite ends of resistors 8 and series resistors 1, 2 and 5 are connected to the positive side of a D.C. source 27 via resistor 28. The negative side of source 27 is connected to terminal 113 of DAC 110. For purposes of the explanation to be provided regarding the "forced null" action, the CSLD 120 will be considered to be a N-channel JFET as shown in FIG. 3. Other assumptions include the use of a CRVS 121 of 10 volts plus a 60 volt D.C. source 27, a 100K ohm resistor for resistor 28 and 300 ohm for resistor 8 with 100 ohms for resistors 1 and 2 and 200 ohms for resistors 5 and 6. The DAC 110 is assumed to be an 8-bit DAC. The supply voltages (not shown) for the operational amplifier 17 are a positive voltage of about +5 volts and a negative voltage of about −20 volts.

Assume the output of the operational amplifier 117 in FIG. 3 is at zero volts due to a prior condition, when no currents flowed through the DAC 110 and the voltage between terminals 111 and 112 is then zero. When a digital input of 10000000 is then applied to the input 14 of the 8-bit DAC, the DAC internal resistance between terminal 111 and 113 and between 112 and 113 will be the same. Currents flow toward terminals 111 and 112 with the JFET 120 conducting at a level such that a "forced null" condition does not exist initially. A positive voltage signal will be presented to the inverting input of operational amplifier 117 which, after a short lag time, causes a negative voltage to be presented at the output of the operational amplifier reducing the gate to source voltage of the JFET 120 causing it to be less conductive. This results in an increase in the drain to source voltage of the JFET 120 to a higher positive value causing the magnitude of the inverting input of the operational amplifier 117 to be reduced, which, after a short lag time, causes an increase in a negative direction of the output from the operational amplifier. The gate to source voltage of the JFET 120 is thereby decreased to further reduce the level of conduction of the JFET causing the drain to source voltage of the JFET to increase, thereby further reducing the magnitude of the inverting voltage input to the operational amplifier. In this manner, the voltage input to the operation amplifier will be reduced to zero and in this sense, the feedback circuit portion is considered as functioning to produce a "forced null" at the inputs to the operational amplifier 117.

As described earlier, the digital input at 114 determined the relative magnitude of the current at terminals 111 and 112, wherein the total of these currents remain the same provided the voltages at terminals 111 and 112 are the same. As indicated earlier, if the digital input to an 8-bit DAC was "00000000", then all of the DAC internal switches direct the current, $I_{113}$, at terminal 113 to flow via the grounded terminal 112 such that the current at terminal 111, $I_{111}$, is zero. The current flow via terminal 112 is referred to as current $I_{112}$. It was also indicated if the digital input were "11111111", only 1/256 of the current through the DAC passes through the grounded terminal 112. Similarly, a digital input of "10000000" causes an equal split of the current between terminals 111 and 112. Consider the decimal value, D, for the two digital inputs 37 11111111" and "10000000", D=255 and 128 respectively. For D=255, the currents can be expressed mathematically as follows:

$$I_{111} = \frac{255}{256} I_{113} = \frac{255}{256} (I_{111} + I_{112})$$

and for D=128

$$I_{111} = \frac{128}{256} I_{113} = \frac{128}{256} (I_{111} + I_{112})$$

"256" is the decimal representation of $2^8$, where "8" is the number of bits of resolution of the DAC example. Using this information, the above equations for $I_{111}$ can be expressed in more general terms as follows:

$$I_{111} = \frac{D}{2^N} (I_{111} + I_{112}) \text{ or}$$

$$\frac{D}{2^N} = \frac{I_{111}}{I_{111} + I_{112}};$$

where N is the number of bits for the DAC. Accordingly, a desired ratio by which the current through the DAC is split is readily obtained by selection of the digital input to the DAC since the total current through the DAC remains unchanged. The controller 115 then functions to force a null at terminals 111 and 112 which is needed to have the total current remain unchanged independent of the split in the current that is selected by the digital input.

Referring to FIG. 2 for the distance to strap mode (4-conductor), with resistor 8, a calibrated resistor that is known, the resistance of a faulted lined, represented by resistors 1 and 2 can be determined. This can be accomplished by monitoring the voltage between terminal 112 and the juncture of resistors 2 and 5 via the terminal 23 at the end of resistor 6 and changing the digital input to the DAC 110 in a controlled manner until such voltage is a minimum. At such time, $$I_{112}R_8 = I_{111}(R_1 + R_2).$$

Then, $$\frac{I_{111}}{I_{111} + I_{112}} = \frac{R_8}{R_8 + R_1 + R_2}$$

From the earlier explanation given, it is also known that $$\frac{D}{2^N} = \frac{I_{111}}{I_{111} + I_{112}}$$

so that $$\frac{D}{2^N} = \frac{R_8}{R_8 + R_1 + R_2} = W_{dts}$$

where $W_{dts}$ is the normalized fractional number. Solving the last equation for $R_1 + R_2$:
Then, $$R_1 + R_2 = R_8 \left( \frac{1 - W_{dts}}{W_{dts}} \right)$$

With everything known on the right hand side of the last equation, the value for $R_1 + R_2$ can be calculated. The length of the conductor represented by resistors 1 and 2, i.e., the distance to the strap (D.T.S.), can then be calculated if the temperature of the conductor, the metal wire size and twist factor of the conductor are known. The temperature conversion factor, Kt along with a gauge conversion factor, Kg for converting the resistance value for $R_1 + R_2$ to distance are known constants dependent on the conductor temperature and gauge. Thus, $$D.T.S. = (R_1 + R_2)KtKg = R_8 \left( \frac{1 - W_{dts}}{W_{dts}} \right) KtKg$$

Such voltage monitoring involving the adjustment of the digital input to the DAC 110 for minimum voltage between terminal 23 and ground and the calculation of the length of the conductor (distance to strap), represented by resistors 1 and 2, is automatically done by the circuit portion 33 shown in FIG. 1.

Referring to FIG. 1, the amplifier 9 is used to monitor the voltage between terminal 23 and ground in that it has one input connected to ground with its other input connected to the terminal 23 via relay 15, which is in the reset position. The output of amplifier 9 presents a signal the polarity and magnitude of which is a measure of the difference in the voltage present between ground and terminal 23. The voltage at terminal 23 is the same as the voltage at the far end of the conductor represented by resistors 1 and 2, i.e., the juncture of resistor 2 and resistor 5 provided by the strap 25. This "error" signal provided at the output of amplifier 9 is passed to the A to D converter 34 for transforming the analog error signal at the output of amplifier 9 to a digital signal for use under the control of the microcomputer 37 with the computer program stored in the control program ROM which changes the digital input at 114 of DAC 110 in a manner to reduce the error signal input to the amplifier 9 to a minimum. The circuit of FIG. 1 thus provides a closed feedback loop for adjusting the current split provided by the current split circuit portion 29 to obtain a "null" or minimum error signal at the input to amplifier 9. The gauge conversion factor Kg, and the temperature coefficient of resistance needed to determine the temperature conversion factor, Kt, of the conductors being tested are entered into the ROM of the microcomputer 37 prior to the use of the measurement circuitry. The resistance value of the calibrated resistor 8 is placed in the ROM of the microcomputer 37 at the time the measurement circuitry of FIG. 1 is manufactured. Once the "null" condition is attained for the circuit of FIG. 1, the programmed microcomputer 37, based on the last mathematical equation set forth above, uses the digital input that is then provided to the DAC 110 plus the stored resistance value of the resistor 8 to calculate the combined resistance of resistor 1 and 2 which it then multiplies by the guage conversion factor, Kg, and the temperature conversion factor, Kt to provide a result which is the length of conductor represented by the resistors 1 and 2 from the terminal 19 to terminal 20 or distance to the strap (D.T.S.). This result is displayed on the display 39.

It is thus seen that the circuitry of FIG. 1 provides a quick and accurate measurement of the distance to the strap (D.T.S.) without the operator having to make any calculations or manual adjustments.

As indicated earlier, the percent fault locate mode (4-conductor) of operating the measurement circuitry determines the ratio of the resistor 1 to the sum of resistors 1 and 2 which ratio, when multiplied by the D.T.S., provides the distance to the fault (D.T.F.) as measured from the measurement circuit end of the second conductor. This calculation also is carried out by the programmed microcomputer 37.

Figure 5:
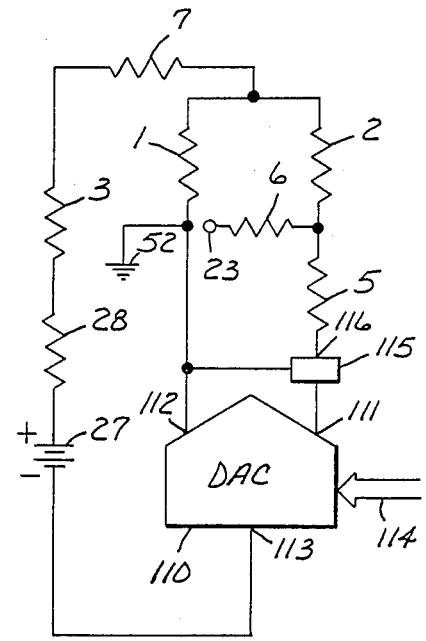
FIG. 5 is a simplified schematic of the circuit shown in FIG. 4.
Figure 4:
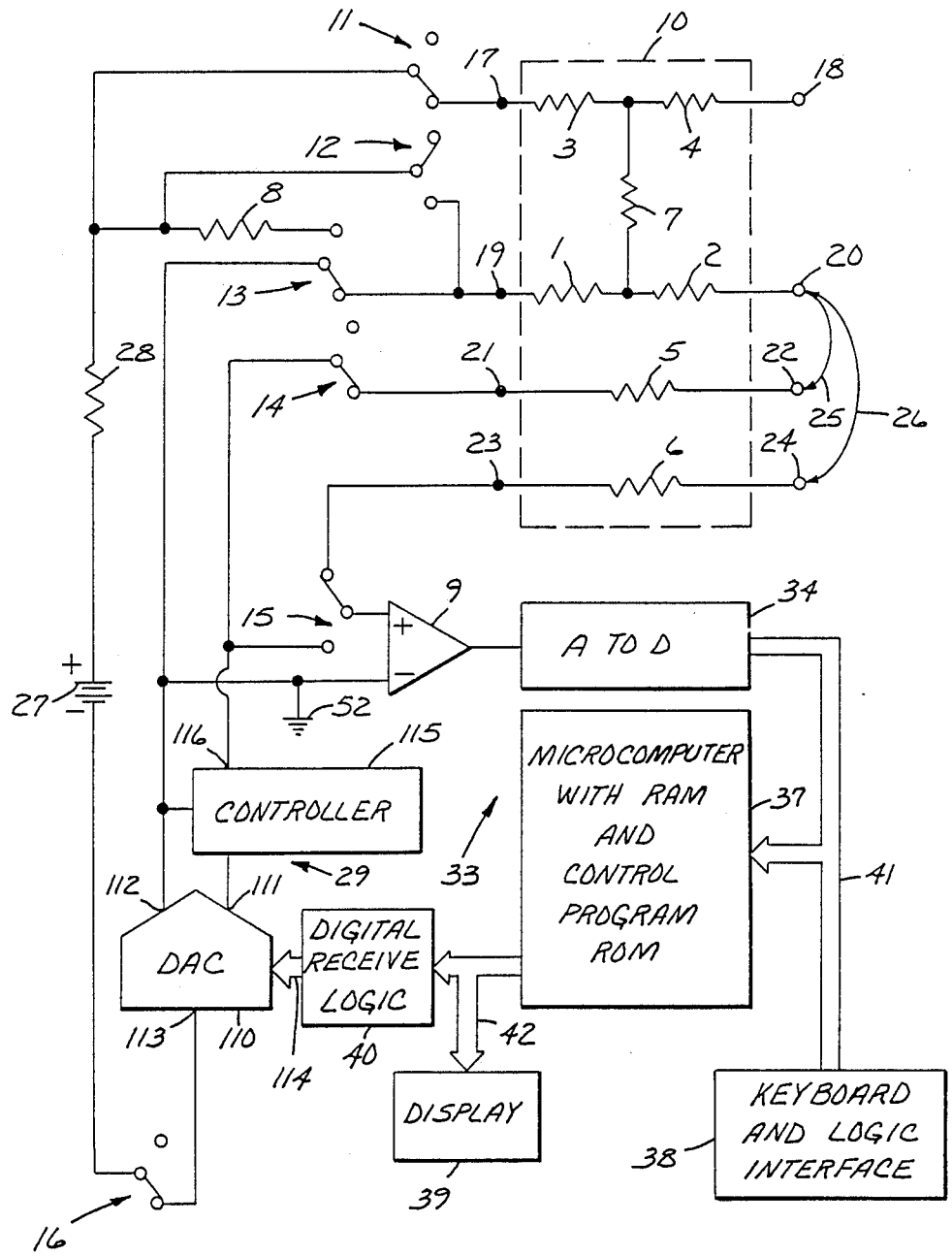
FIG. 4 is a schematic of the fault measurement circuit embodying the invention arranged for another mode of operation.

FIG. 4 shows the measurement circuitry of FIG. 1 in the present fault locate mode (4-conductor) wherein relays 11, 13, 14 and 16 are set with relays 12 and 15 reset. FIG. 5 is a simplified schematic of such circuitry, but without the circuit portion 33. As can easily be seen in FIG. 5, the current flow $I_{111}$ at terminal 111 of DAC 110 flows through resistor 2 with the current $I_{112}$ of DAC 110 flowing through resistor 1 for the percent fault locate mode. A voltage "null" is obtained between ground and terminal 23 by operation of the circuit portion 33 giving rise to the following relationship:

$$I_{111}R_2 = I_{112}R_1$$

Then, $$\frac{I_{111}}{I_{111} + I_{112}} = \frac{R_1}{R_1 + R_2}$$

From the earlier explanation given, it is also known that $$\frac{D_{pfl}}{2^N} = \frac{I_{111}}{I_{111} + I_{112}},$$

so that $$\frac{D_{pfl}}{2^N} = \frac{R_1}{R_1 + R_2} = W_{pfl},$$

where $D_{pfl}$ is the decimal value of the binary input at 114 of the DAC 110 when a "null" is obtained between ground and terminal 23 of FIGS. 4 and 5 for the "percent fault locate" mode (4-conductor), with N being the number of bits in the DAC 110 and $W_{pfl}$ the normalized fractional number.

The length of the first conductor or distance to strap, D.T.S., obtained from the sum of the resistance of resistors 1 and 2 was determined earlier in connection with the use of the measuring circuit in the distance to strap mode (4-conductor) as set forth in FIGS. 1 and 2. The length or distance to the fault, D.T.F., can be then determined automatically by the circuit portion 33 by multiplying the D.T.S. (stored in RAM) by $W_{pfl}$ or in equation form $$D.T.F. = D.T.S. \times W_{pfl}$$

Figure 7:
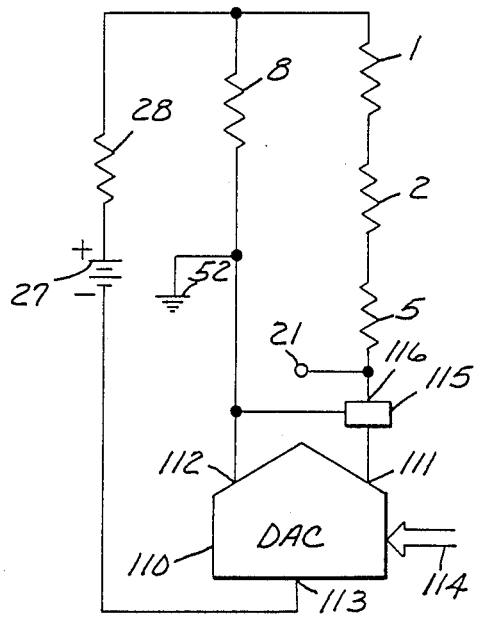
FIG. 7 is a simplified schematic of the circuit shown in FIG. 6.
Figure 6:
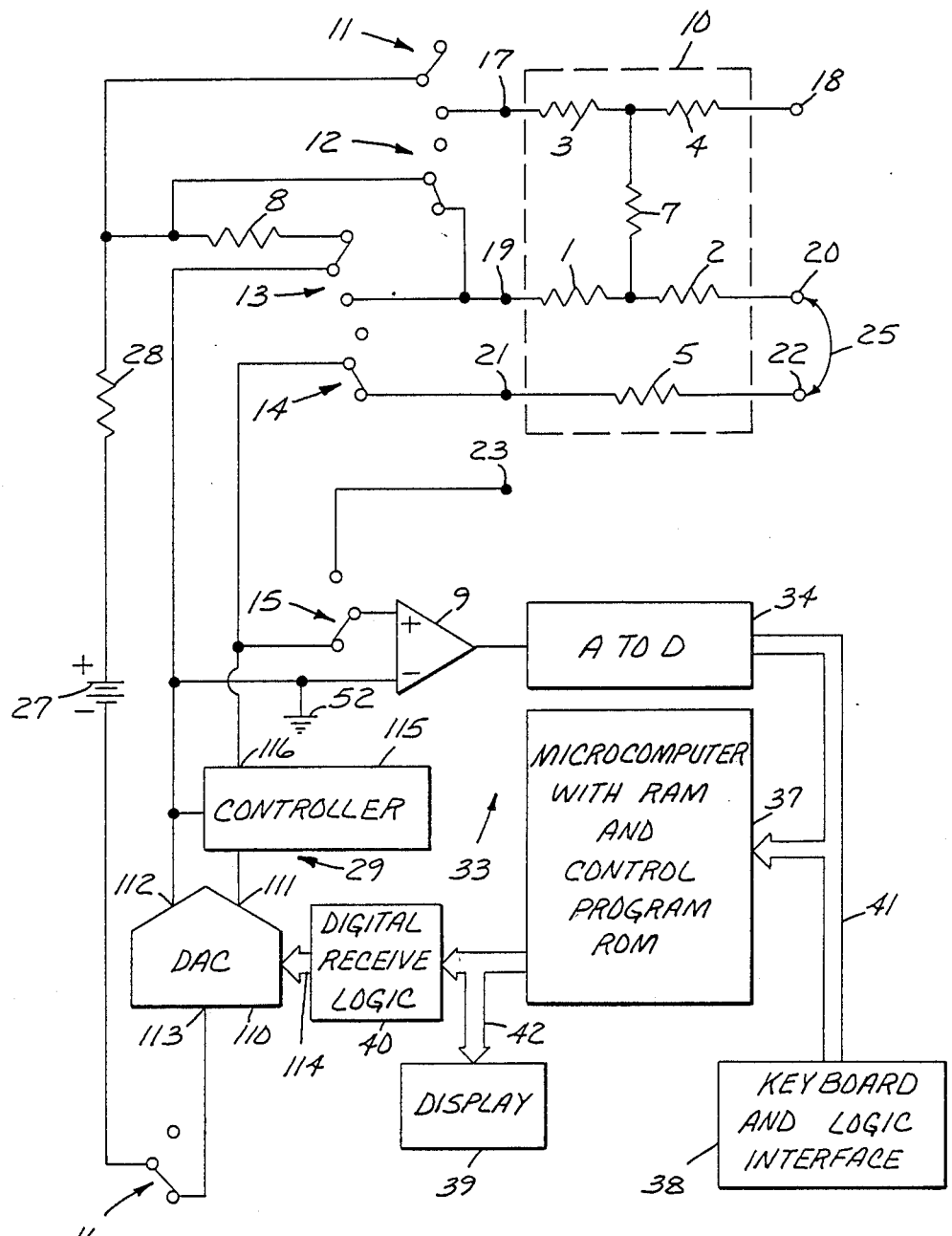
FIG. 6 is a schematic of the fault measurement circuit embodying the invention arranged for a further mode of operation.

The measurement circuitry of the invention can also be operated to determine the distance to strap (D.T.S.) using onlu three conductors, i.e., the two faulted conductors represented by resistors 1 and 2 and by resistors 3 and 4 plus one good conductor such as that represented by resistor 5. FIG. 6 shows this 3-conductor mode of operation wherein the strap 26 is not utilized nor is the fourth conductor (resistor 6). In this mode relays 12, 14, 15 and 16 are set with relays 11 and 13 in the reset position. As mentioned previously, the 3-conductor mode can be used if it can be assumed that the resistance of the third conductor (resistor 5) is approximately equal to the faulted first conductor (resistors 1 and 2). FIG. 7 is a simplified schematic of the circuitry of FIG. 6, less the circuit portion 33. In this arrangement, the current $I_{112}$ at terminal 112 of DAC 110 flows through the known calibrated resistor 8 with the current $I_{111}$ at terminal 111 of DAC 110 flowing through the series connected second conductor (resistors 1 and 2) and the third conductor (resistor 5). When a voltage "null" is obtained between ground and terminal 21 by operation of the circuit portion 33, the following relationship exists:

$$I_{112}R_8 = I_{111}(R_1 + R_2 + R_5)$$

Then, $$\frac{I_{111}}{I_{111} + I_{112}} = \frac{R_8}{(R_1 + R_2 + R_5) + R_8}$$

From the earlier explanation given, it is also known that $$\frac{D}{2^N} = \frac{I_{111}}{I_{111} + I_{112}}, \text{ so}$$

$$\frac{D}{2^N} = \frac{R_8}{(R_1 + R_2 + R_5) + R_8} = W_{dts};$$

where D is the decimal value of the binary input at 114 of the DAC 110 when a "null" is obtained between ground and terminal 21 of FIGS. 6 and 7 for the 3-conductor mode for determining the distance to the fault, with N being the member of bits in the DAC and $W_{dts}$ the normalized fractional number. Since the 3-conductor mode is based on the assumption that the resistance of the third conductor (resistor 5) is approximately equal to the faulted first conductor (resistors 1 and 2), then $$\frac{R_8}{2(R_1 + R_2) + R_8} = W_{dts}$$

Solving for $R_1+R_2$, $$R_1 + R_2 = \frac{R_8}{2}\left(\frac{1 - W_{dts}}{W_{dts}}\right)$$

$R_1+R_2$ can then be determined since everything is known on the right side of the equation. Further, the resistance, $R_1+R_2$, can be converted to distance by multiplying by the gauge conversion factor, Kg and by the temperature conversion factor, Kt to obtain the distance to the strap, D.T.S. Thus $$D.T.S. = (R_1 + R_2)KgKt = \frac{R_8}{2}\left(\frac{1 - W_{dts}}{W_{dts}}\right)KgKt$$

This distance, as in the case of the 4-conductor mode for determining D.T.S., will be displayed on the display 39 and is stored in the RAM of microcomputer 37. The above calculations are done, by the programmed microcomputer 37.

Figure 9:
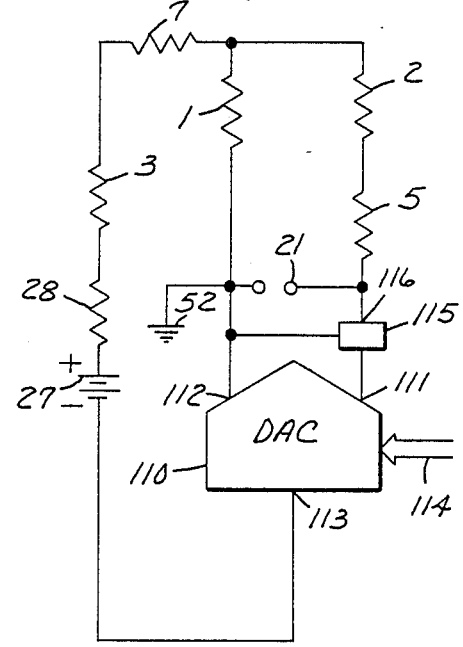
FIG. 9 is a simplified schematic of the circuit shown in FIG. 8.
Figure 8:
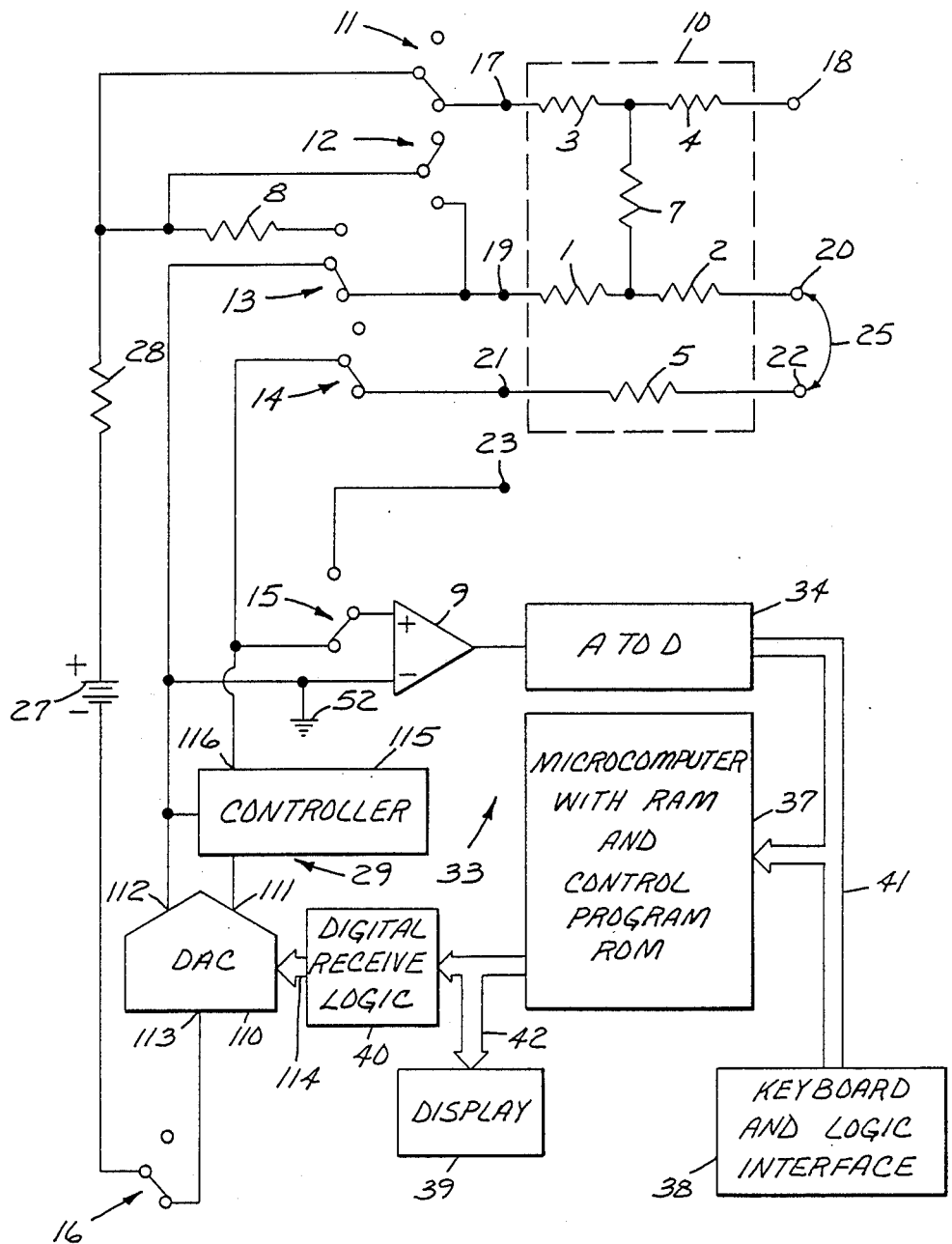
FIG. 8 is a schematic of the fault measurement circuit embodying the invention arranged for a still further mode of operation.

The percent fault locate mode for the 3-conductor mode is then carried out which requires relays 11, 13, 14, 15 and 16 to be set with relay 12 reset to provide the arrangement shown in FIG. 8. FIG. 9 is a simplified schematic of FIG. 8, less the circuit portion 33. As can be easily seen in FIG. 9, the current flow $I_{111}$ at terminal 111 of DAC 110 flows through series connected resistors 2 and 5 with the current $I_{112}$ at terminal 112 of DAC 110 flowing through resistor 1 for the 3-conductor percent fault locate mode. A voltage "null" is obtained between ground and terminal 21 by operation of the circuit portion 33 giving rise to the following relationship $$I_{111}(R_2+R_5)=I_{112}R_1$$

Then, $$\frac{I_{111}}{I_{111} + I_{112}} = \frac{R_1}{R_1 + R_2 + R_5}$$

From the earlier explanation given, it is also known that $$\frac{D_{pfl}}{2^N} = \frac{I_{111}}{I_{111} + I_{112}},$$

so that $$\frac{D_{pfl}}{2^N} = \frac{R_1}{R_1 + R_2 + R_5} = W_{pfl}$$

when D is the decimal value of the binary input at 114 of DAC 110 when a "null" is obtained between ground and terminal 21 of FIGS. 8 and 9, with N being the number of bits in the DAC 110 and $W_{pfl}$ the normalized fractional number.

Solving the last euation for $R_1$, the resistance for $R_1$, the resistance representative of resistance of the resistance of the first conductor to the fault, and using the fact that $R_5$ was considered equal to $R_1+R_2$ for the 3-wire mode, then $$R_1=W_{pfl}\times 2 (R_1+R_2),$$

which expressed in terms of distance is $$D.T.F.=W_{pfl}\times 2 \text{ D.T.S.}$$

D.T.F. can be calculated by the circuit portion 33 since everything is known on the right hand side of the equation for D.T.F.

As indicated for the determination of the distance to the strap using the 4-conductor mode, the determination of the distance to the fault using the 4-conductor mode as well as the distance to strap and distance to fault determination using the 3-conductor mode are made quickly and accurately via the programmed microcomputer 37 without the operator making any calculations or manual adjustments.

Figure 10:
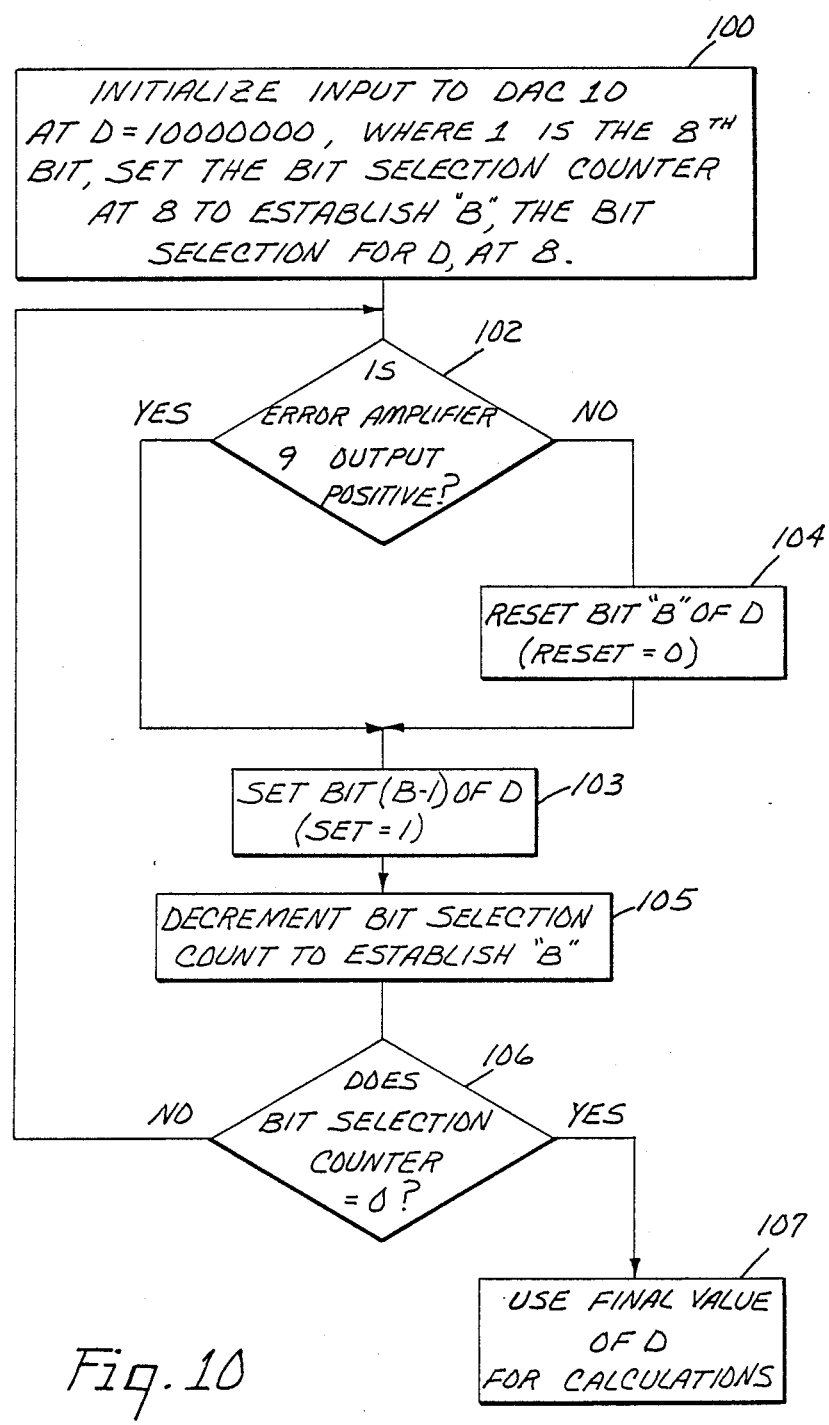
FIG. 10 is a flow diagram for obtaining the null position.

The foregoing description makes reference to the use of the circuit portion 33 for obtaining the required "null" at the monitoring points for the various modes which connect to the input of the "error" amplifier 9. One way by which the "null" can be obtained is set forth in the flow diagram for a program depicted in FIG. 10 that can be used with the microcomputer 37 whereby the digital input 114 of DAC 110 is automatically adjusted to obtain the "null" condition. The flow diagram is based on a successive appoximation control routine that is well known. The flow diagram, by way of example, assumes the DAC 110 is an 8-bit DAC. As indicated in flow diagram at 100, the successive approximation control routine includes an initializing input step for the digital input, D to the DAC 110, wherein the mid-value for the DAC is provided by the microcomputer 37 to the DAC input 114. For the DAC 110, which is assumed to be an 8-bit DAC, such initializing input is 1000000 so that the 8th bit is the only bit set at "1". This selection is reflected in a counter provided by the microprocessor 37 which is set at 8 to establish "B", the bit selection that was last considered. Any initializing input can be used, but use of the mid-value makes use of the fact that the "null" condition has an equal chance of being above or below the mid-value to thereby provide the best average time required for reaching the "null" condition input for the DAC 110 for any given situation. A determination is then made at 102 as to whether the output of the error ampllifier 9 is positive. If such output is positive, there is need to change the current split so that the current at terminal 112 of DAC 110 is reduced and the current at terminal 111 is increased. This is accomplished by increasing the value of the DAC input at 114. Thus, as indicated at step 103, an increase in D for the input to 114 as indicated wherein the bit B-1 of d is set to "1". Similarly, if such output is not positive, i.e. the output of amplifier 9 is negative, there is need to change the current split so the current at terminal 111 of DAC 110 is reduced and the current at terminal 112 is increased. This is accomplished by reducing the value of the DAC input word, D. Thus, an incremental decrease in D is initiated at 104 of the flow diagram wherein the bit B of D is reset to "0" with the bit B-1 of d is set to "1" at 103 to complete the decrease. The bit selection counter for the DAC input word is then decremented by 1, as indicated at 105 of the flow diagram, to establish the bit of d that was set to 1 at 103. Provision is therefore provided at 106 for determining whether the bit selection counter is equal to "0". At this point of the routine as described, the answer to the query at 106 would be "no" causing the routine to return to 102 to be repeated. As indicated at 107 of the flow diagram, when the answer to the query at 106 is "yes", the final value of D is then used for the calculations to be performed as indicated at 107 to determine whether the change made in the input 114 to the DAC caused the error amplifier 9 to present a positive output. The program described is repeated until step 106 is reached and the answer to the question, "Does the bit selection counter=0?" is "yes", causing step 107 to be reached wherein the value of "D" that then exists is used for making the calculations required for the operating mode that may have been selected for the test circuitry.

The particulars of the foregoing description are provided merely for purposes of illustration and are subject to a considerable latitude of modification without departing from the novel teachings disclosed therein. Accordingly, the scope of this invention is intended to be limited only as defined in the appended claims, which should be accorded a breadth of interpretation consistent with this specification.

I claim:

1. A resistance fault locator circuit adapted for connection to a plurality of conductors which extend between the locator circuit and a remote point with two of the conductors known to have a fault between them, the locator circuit operable for determining the distance from the circuit to the fault, the locator circuit including:
   a current split circuit having first, second and third terminals and a digital input, a digital input signal to said digital input determining the ratio of the current at said first terminal to the sum of the currents at said first and second terminals;
   an error amplifier providing an analog signal at its output dependent on the polarity and magnitude of an analog signal supplied to its input;
   an analog to digital converter circuit connected to the output of said error amplifier for providing a digital signal representative of the output of said error amplifier;
   a programmed microcomputer connected to respond to the output of said analog to digital converter circuit to establish the digital input signal to said digital input to cause magnitude of an analog signal supplied to the input of said error amplifier to be reduced to a minimum level;
   a resistor of known value;
   switching means operable for establishing a first and a second mode of operation of the locator circuit, said first mode determining the distance along said one of the two conductors between the locator circuit and the remote end of said one conductor, said second mode determining the ratio of the resistance of said one conductor between the locator circuit end of said one conductor and the fault to the resistance of said one conductor, said programmed microcomputer operable to multiply the results of the first and second modes of operation to obtain the distance to the fault from the locator circuit end of said one conductor, said switching means providing connections for said first mode of operation for the passage of the current at said first terminal through said one conductor with current at said second terminal flowing through said resistor with said resistor connected at one end to the locator circuit end of said one conductor and the input of said error amplifier connected for receiving the signal between the other end of said resistor and the remote point end of said one conductor and said switching means providing connections for said second mode of operation for the passage of current at said first terminal between the fault position at said one conductor and the remote end of said one conductor with the current at said second terminal flowing between the fault at said one conductor and the locator circuit end of said one conductors with the input of said error amplifier connected for receiving the signal between the ends of said one conductor.

2. A resistance fault located circuit according to claim 1 wherein said switching means is operable for establishing a third and fourth mode of operation of the locator circuit, said third mode determining the distance along said one of the two conductors between the locator circuit and the remote end of said one conductor, said fourth mode determining the ratio between the resistance of said one conductor between the locator circuit end of said one conductor and the fault position to the resistance of said one conductor plus the resistance of an unfaulted conductor of the plurality of conductors, said programmed microcomputer operable to obtain twice the multiple of the results of the third and fourth modes of operation to obtain the distance to the fault from the locator circuit end of said one conductor, said switching means providing connections for said third mode of operation for the passage of the current at said first terminal through a series circuit of said one conductor and an unfaulted conductor of the plurality of conductors with current at said second terminal flowing through said resistor with said resistor connected at one end to the locator circuit end of said one conductor and the input of said error amplifier connected for receiving the signal present between the other end of said resistor and the locator circuit end of said last-mentioned unfaulted conductor and said switching means providing connections for said fourth mode of operation for connections for the passage of current at said first terminal via a series circuit including said one conductor from the fault position at said one conductor to the remote end of said one conductor and an unfaulted conductor of the plurality of conductors and for the passage of current at said second terminal through said one conductor from the fault position at said one conductor to the locator circuit end of said one conductor with the input of said error amplifier connected for receiving the signal between the locator circuit end of said one conductor and the locator circuit end of said last-mentioned unfaulted conductor.

3. A resistance fault locator circuit according to claim 1 wherein said current split circuit includes:
   a multiplying digital to analog converter (DAC) and a controller circuit portion, said DAC having a first terminal, said second and third terminals of said current split circuit plus said digital input and said controller having said first terminal of said current split circuit, the current at said first terminal of said DAC and second terminal of said current split circuit being in accordance with the said first-mentioned ratio provided said first terminal of said DAC and second terminal of said current split circuit are at the same potential, said controller circuit portion connected to said DAC for establishing said first terminal of said DAC and second terminal of said current split circuit at the same potential, said controller circuit portion having
(1) an operational amplifier with two input terminals and an output terminal, one of said input terminals operatively connected to said first terminal of said DAC and the other of said two input terminals connected to said second terminal of said current split circuit; and
(2) a negative feedback semiconductor linear circuit (NFSLC) operatively connected between said output terminal of said operational amplifier and said first terminal of said DAC, said NFSLC having a circuit portion for conduction of the current between said first terminal of said DAC and said first terminal of said current split circuit.

4. A resistance fault locator circuit according to claim 3 wherein said circuit portion of said NFSLC includes a controlled semiconductor linear device (CSLD) having a control electrode operatively connected to said output terminal of said operational amplifier.

5. A resistance fault locator circuit according to claim 4 wherein said circuit portion of said NFSLC includes a constant reference voltage source connected between said CSLD and said first terminal of said DAC.

* * * * *